United States Patent [19]

Meissner

[11] Patent Number: 5,317,266
[45] Date of Patent: May 31, 1994

[54] LOCAL ANTENNA WITH HOMOGENEOUS SENSITIVITY FOR A NUCLEAR MAGNETIC RESONANCE IMAGING APPARATUS

[75] Inventor: Ralph Meissner, Erlangen, Fed. Rep. of Germany

[73] Assignee: Siemens Aktiengesellschaft, Munich, Fed. Rep. of Germany

[21] Appl. No.: 974,120

[22] Filed: Nov. 10, 1992

[30] Foreign Application Priority Data

Nov. 22, 1991 [DE] Fed. Rep. of Germany ....... 4138459
Sep. 21, 1992 [DE] Fed. Rep. of Germany ....... 4231584

[51] Int. Cl.$^5$ ........................................... G01R 33/20
[52] U.S. Cl. .................................. 324/318; 324/322
[58] Field of Search .................. 128/653.5; 324/300, 324/307, 309, 310, 311, 312, 313, 314, 318, 319, 322

[56] References Cited

U.S. PATENT DOCUMENTS

| | | | |
|---|---|---|---|
| 4,733,190 | 3/1988 | Dembinski | 324/318 |
| 5,006,805 | 4/1991 | Ingwersen | 324/322 |
| 5,065,760 | 11/1991 | Krause et al. | 128/653 |
| 5,144,244 | 9/1992 | Kess | 324/322 |

FOREIGN PATENT DOCUMENTS 3628035 2/1988 Fed. Rep. of Germany .

OTHER PUBLICATIONS

"Hochfrequenzsysteme für die Kernspintomografie," Dürr et al., ntzArchiv vol. 11, No. 5 (1989) pp. 237-242.

*Primary Examiner*—Michael J. Tokar
*Attorney, Agent, or Firm*—Hill, Steadman & Simpson

[57] ABSTRACT

A local antenna for transmitting and/or receiving radio frequency signals in a nuclear magnetic resonance imaging apparatus includes first and second sub-antennas which are axially spaced from each other. The sub-antennas each are composed of at least one conductor turn. An electrical series circuit is formed of the first sub-antenna, a capacitive element for shortening the path length effective for the radio frequency signal and of the second sub-antenna. The two sub-antennas have the same winding direction. A capacitor is connected in parallel with the series circuit. The respective capacitance values of the series capacitive element and the parallel capacitor are approximately the same. For constructing a local antenna system especially suitable for mammography, two such local antennas are arranged side-by-side and are electrically connected in parallel. The series capacitive elements of the two local antennas face each other.

10 Claims, 3 Drawing Sheets

LOCAL ANTENNA WITH HOMOGENEOUS SENSITIVITY FOR A NUCLEAR MAGNETIC RESONANCE IMAGING APPARATUS

BACKGROUND OF THE INVENTION

1. Field of the Invention

The present invention is directed to a local antenna for transmitting and/or receiving radio frequency signals in a nuclear magnetic resonance imaging apparatus, of the type having first and second axially spaced sub-antennas, with each sub-antenna being formed by at least one conductor turn.

2. Description of the Prior Art

A local antenna of the aforementioned type, having axially spaced first and second sub-antennas, with each sub-antenna being formed by at least one conductor turn, is described in German OS 36 28 035. The local antenna disclosed therein is specifically for nuclear magnetic resonance imaging, with the two sub-antennas being secured to a stand. Each sub-antenna, constituting a coil, has a variable capacitor connected thereto, with the variable capacitors for the respective sub-antennas being set to respectively different capacitances, thereby forming two different sets of resonant conditions. The two sub-antennas are connected in parallel, and form a Helmholtz arrangement wherein the distance between the coils is prescribed by their diameters. As a result, this known local antenna cannot be adapted as well as desired to the anatomy of a body part to be examined. The signal-to-noise ratio is therefore degraded, in some instances due to a filling factor for the local antenna which is too low.

Another local antenna is disclosed in U.S. Pat. No. 4,733,190. This local antenna design includes a base carrier on which two local coils are arranged axially spaced from each other. Each local coil is composed of two so-called "loop-gap" resonators connected oppositely in parallel, with the local coils being connected in parallel via the base carrier. The spacing of the two local antennas from each other can be set, dependent on the size of the body part to be examined, so that the anatomical structures of a hand as well as a thigh or a head can be covered with the local antenna design. This is accomplished by plugging the respective local antennas into the base carrier in sets of receptacles in the base carrier which are differently spaced from each other. Because the resonant frequency of the loop-gap resonator is principally defined by its geometry, the manufacture and formatting are relatively complicated, because tight tolerances must be observed. Moreover, loop-gap resonators can generate undesired oscillatory modes, which are difficult to suppress. If such modes are incompletely suppressed, unwanted coupling of the antennas to the excitation system can arise.

SUMMARY OF THE INVENTION

It is an object of the present invention to provide a local antenna for nuclear magnetic resonance imaging of larger body parts having homogenous sensitivity and which is simple to construct.

The above object is achieved in accordance with the principles of the present invention in a local antenna having first and second sub-antennas axially spaced from each other, and including an electrical series circuit formed of the first sub-antenna, of a capacitive element for shortening the path length effective for the radio frequency signal, and of the second sub-antenna. Both sub-antennas have the same winding direction. A parallel capacitor is connected in parallel with the series circuit, and the capacitances of the capacitive element and of the parallel capacitor are approximately the same.

As a result of the series connection and the approximately identical values of capacitances, the current distribution to the two sub-antennas is equal. A good, homogeneous sensitivity is thereby achieved.

Although the coaxially, spaced sub-antennas are connected in series, large diameters can also be achieved by providing the capacitive element which shortens the effective electrical length of one sub-antenna. The advantage of a high signal-to-noise ratio established by the local antenna can thus be used for larger body areas.

In a preferred embodiment, a shield for shielding the electrical components of the electomagnetic field is arranged outside each sub-antenna, and extending around the sub-antenna. This shield has a slot disposed opposite the capacitive element and is continuous in the axial direction. A pronounced detuning of the resonant frequency is thereby avoided, such detuning arising by the dielectric losses of the tissue which occur when the local antenna is placed on the body region to be examined. The capacitive element and the parallel capacitor create a voltage node at those sections of the winding opposite the capacitive element, i.e., the maximum current flows at this location. The shield is slotted at the region adjacent this voltage node because the shielding effect for the electrical component of the electromagnetic field is extremely low at that location. An electrical interruption in the shield is also necessary because the magnetic field lines generated with the surface coil would otherwise be shorted. Additionally, eddy currents generated by the gradient pulses employed in operating the nuclear magnetic resonance imaging apparatus are suppressed by the slot.

In a further embodiment, a controllable high-frequency or radio frequency switch is disposed opposite the capacitive element in each sub-antenna. The high-frequency switch is disposed opposite the capacitive element in the sub-antenna, so that a total of two high-frequency switches are provided in each local antenna. This permits an especially large shift of the resonant frequency to be obtained, so that good decoupling from the operating frequency of the nuclear magnetic resonance imaging apparatus can be achieved.

In a further version of this embodiment, the high-frequency switch consists of a quarter-wave line, having one end connected in the sub-antenna, and the other end terminated with a controllable PIN diode. Because a PIN diode can handle high currents better than high voltages, given the same breakdown capacity, the breakdown capacity of the PIN diode employed is better utilized due to the interposition of the quarter-wave line.

The quarter-wave line may be formed by discrete components. The structural volume of the high-frequency switch can thus be decreased given the operating frequencies which are standard in nuclear magnetic resonance imaging tomography.

A local antenna system can be constructed from two local antennas constructed in accordance with the principles of the present invention. The two inventive local antennas are arranged side-by-side, and are electrically connected in parallel, with the respective capacitive elements of the two local antennas facing toward one other. Decoupling of the two local antennas from each other, and from a whole-body antenna which may be additionally present, can be achieved by means of the controllable high-frequency switches. The reception signal and/or the transmission signal can be tapped or supplied, respectively, without switching. Such a local antenna system is particularly advantageously for use in mammography.

In a further embodiment of such a local antenna system, the two local antennas forming the system are connected in parallel through respective coupling capacitors which are connected in series, and a matching network is connected to the junction points of the coupling capacitors. Any residual detuning which may occur, despite the shield, due to the tissue to be examined can be compensated with the matching network.

DESCRIPTION OF THE PREFERRED EMBODIMENTS

Figure 1:
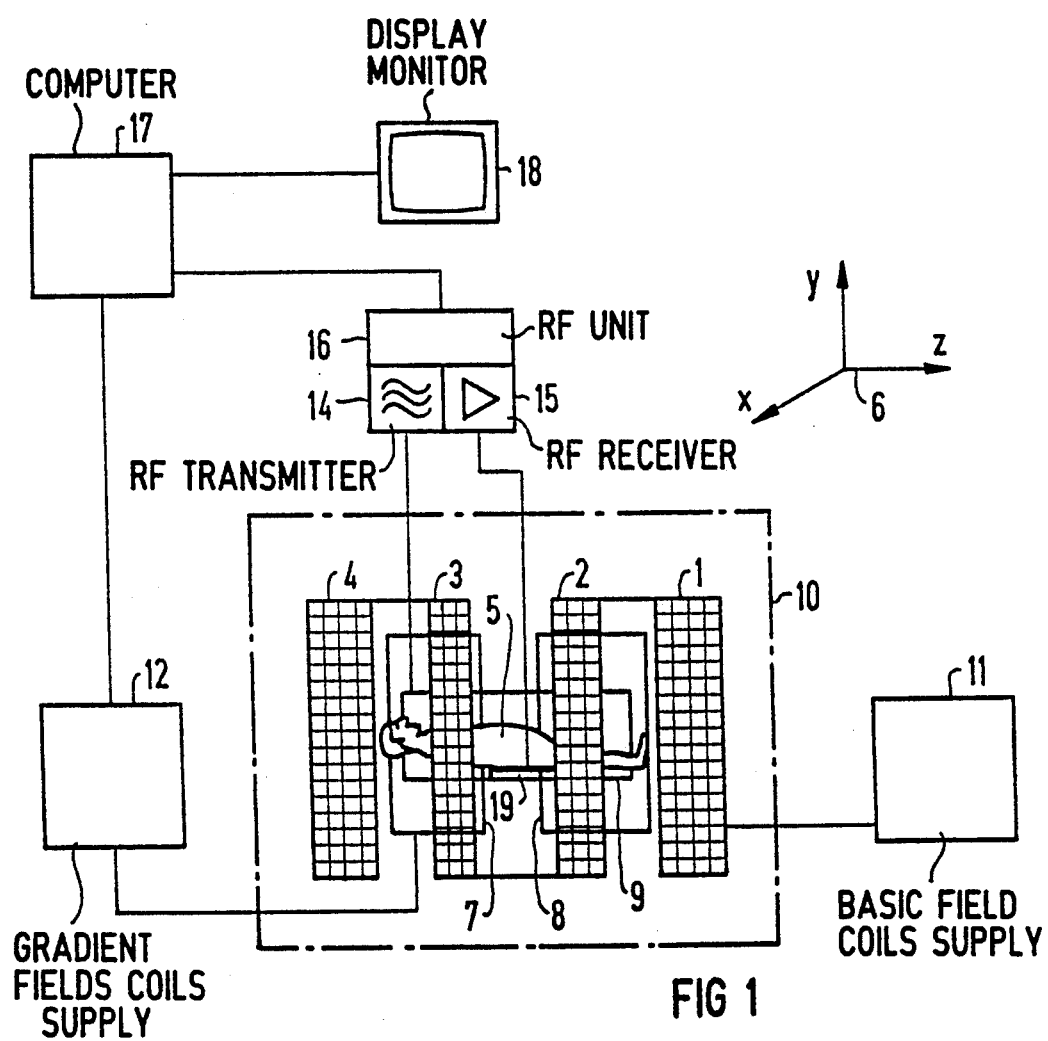
FIG. 1 is a schematic block diagram of a conventional magnetic resonance imaging apparatus, in which a local antenna constructed in accordance with the principles of the present invention can be used.

The basic components of a nuclear magnetic resonance tomography apparatus operating in accordance with the principles of the present invention are schematically shown in FIG. 1. Coils 1 through 4 generate a basic magnetic field $B_O$, in which the body of a patient 5 to be examined is situated, given application of the apparatus for medical diagnostics. Gradient coils are also provided for generating independent magnetic field components respectively perpendicular to one another in the x, y and z directions, conforming to the Cartesian coordinate system 6. For clarity, only the gradient coils 7 and 8 are shown in FIG. 1 which, in combination with identical, oppositely-disposed gradient coils, generate the x-gradient. Coils (not shown) for generating the y-gradient are disposed parallel to, above and below, the patient 5, coils (not shown) for generating the z-gradient field are disposed transversely to the longitudinal axis of the patient 5, at the head and feet.

The apparatus also includes radio frequency antenna 9 which serves the purpose of generating and receiving nuclear magnetic resonance signals. The coils 1, 2, 3, 4, 7, 8 and 9 surrounded by the dot-dash line 10 represent the actual examination instrument. This instrument is operated by an electrical arrangement which includes a power supply 11 for operating the basic field coils 1 through 4 and a gradient fields power supply 12, to which the gradient coils 7 and 8 as well as the other gradient coils are connected. The radio frequency coil 9 is coupled to a process control computer 17 through radio frequency unit 16. Depending upon the status of a switch 19, the apparatus can be operated in a transmission mode, in which case the radio frequency coil 9 will be coupled to the computer 17 through a radio frequency transmitter 15, or in a reception mode, in which case the radio frequency coil 9 is coupled to the computer 17 through a signal amplifier 14. The computer 17 reconstructs an image of a slice of the patient 5 in a known manner from the data obtained during the reception mode, this image being visually displayed on a monitor 18 connected to the computer 17.

Figure 2:
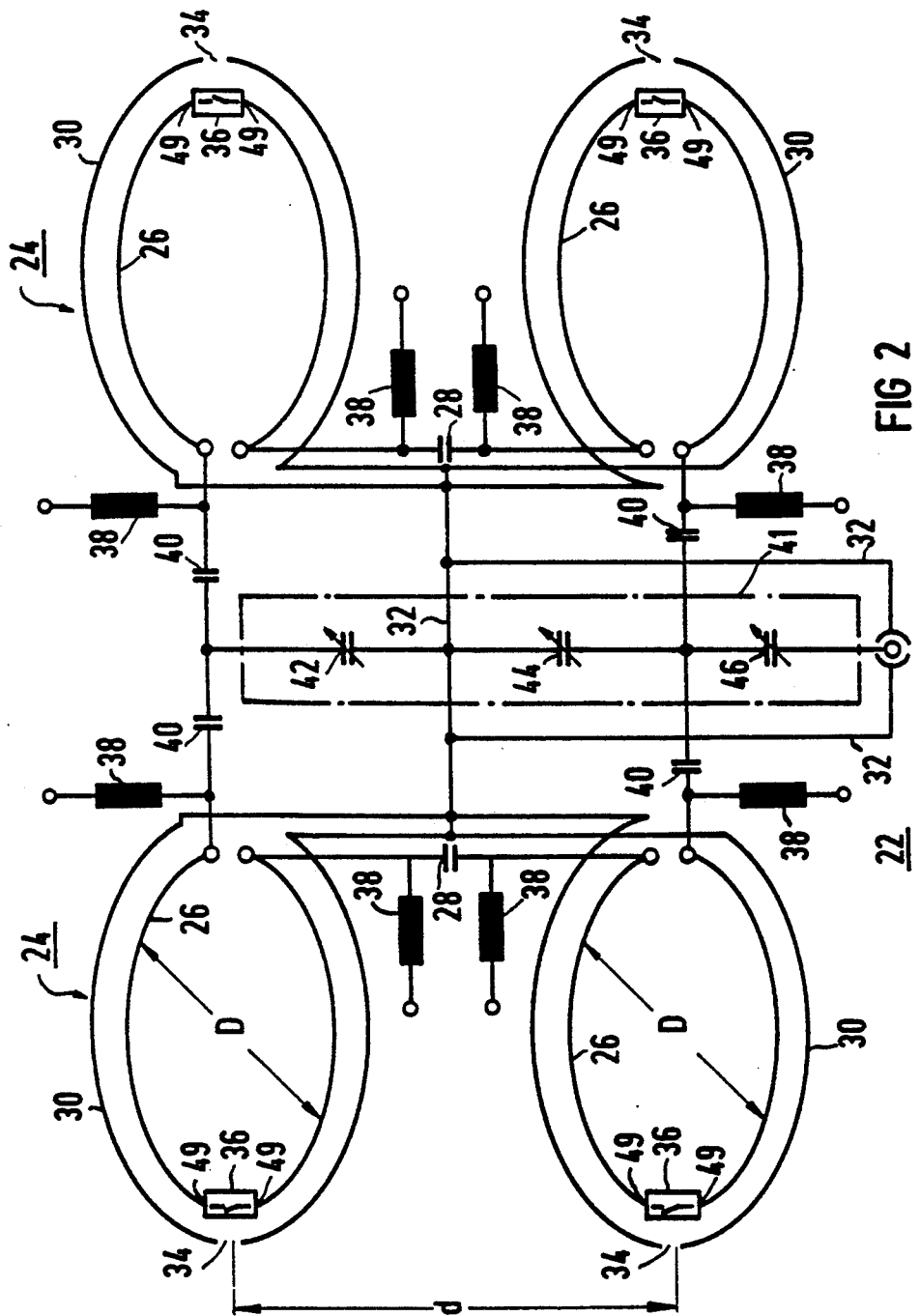
FIG. 2 shows a local antenna system, composed of two local antennas, constructed in accordance with the principles of the present invention.

The local antenna 24, constructed in accordance with the principles of the present invention, will be explained in the context of a local antenna system 22, which is shown in FIG. 2. The local antenna system 22 is composed of two identical local antennas 24, disposed side-by-side and electrically connected in parallel. In the embodiment of FIG. 2, the elements connecting the local antennas 24 are disposed in a single plane (the antenna coils being disposed perpendicularly to this plane). It should be noted, however, that the connecting elements need not be planar, and other arrangements of the two local antennas, adapted to the anatomy under examination, are possible.

Each local antenna 24 is constructed of two coaxial, axially spaced sub-antennas 26, each of which has a circular conductor turn or winding. Rectangular or other winding shapes are alternatively possible. The diameter D of the sub-antenna 26 (i.e., the turn thereof) is approximately 15 cm, and the axial spacing d can vary dependent on the anatomy being examined, and may be, for example, between 4 cm and 6 cm. The two sub-antennas 26 within one local antenna 24 are aligned parallel to each other. In FIG. 2, the lower sub-antennas 26 of the two local antennas 24 are disposed in a first plane, and the upper sub-antennas 26 of the two local antennas 24 are arranged in a second plane, parallel to the first plane. Again, matching to the anatomy is the overriding goal in order to achieve an optimum filling factor of the antenna system, and thus to obtain the best possible signal-to-noise ratio.

The two sub-antennas 26 of a local antenna 24 are connected in series in the same winding direction via a capacitive element 28, in the form of a shortening capacitor. If the two turns (sub-antennas) 26 were connected in series without a shortening capacitor 28, the electrically effective length of the series-connected turns 26 would be approximately between one-fourth and one-half of a wavelength of the electrical high-frequency signal, at the standard operating frequencies of a nuclear magnetic resonance imaging apparatus. The shortening capacitor 28 thus shortens the electrically effective length of the series-connected turns 26 to considerably less than one-quarter of this wavelength. Each turn 26 has the optimum length for generating and receiving the nuclear magnetic resonance signals, despite the relatively large diameter D.

The local antenna 24 has a homogenous characteristic in a volume between the two coaxially spaced turns 26. The extent and shape of the region having this homogenous character can be influenced by the selection of the diameter D and the spacing d of the turns 26. It is also possible to provide further, axially spaced sub-antennas 26 within each local antenna 24, connected in series via further shortening capacitors.

Each sub-antenna 26 is surrounded at its exterior by a shield 30 for shielding the electrical component of the electromagnetic field. The shield 30 is connected to a reference potential conductor 32 in the proximity of the shortening capacitor 28. In order to eliminate the influence of the shield 30 on the field of the individual sub-antennas, a slot 34, extending axially through each shield 30, is disposed opposite the capacitor 28. The shield 30 prevents large variations in the capacitance of the sub-antennas 26 given different loads or different fillings of the local antenna 24. It is also possible to provide a common shield 30 for both sub-antennas 26 within each local antenna 24; if so, such a common shield 30 should also include an axially extending slot 34.

It is important for a homogenous sensitivity that the current maximum be formed in the middle of the sub-antennas 26. To that end, a parallel capacitor is connected in parallel with the input of the local antenna, the parallel capacitor in the embodiment of FIG. 2 being formed by two series-connected tuning capacitors 42 and 44. The value of the capacitance of the parallel capacitor, and of the shortening capacitor 28, are identical in the ideal sense when the current maximum is precisely in the middle of the turns 26. In practice, however, this precision is unlikely to exist, and therefore the capacitance values will be approximately identical.

Because the tuning capacitors 42 and 44 are set for a prescribed load, the capacitive element 28 would theoretically also have to be correspondingly variable. At standard operating frequencies, however, the wavelengths are so long in comparison to the coil dimensions that slightly different values of capacitance do not constitute a disturbing factor. In practice, therefore, the capacitive elements are not varied dependent on the load.

For mutually decoupling the local antennas 24 from one another, or for decoupling the local antenna system 22 from a separate transmission antenna or from other local antennas, a high-frequency switch 36 is disposed in each sub-antenna 26 in the proximity of the slot 34. The high-frequency switch 36 can be a mechanical or an electronic high-frequency switch which, for example, includes a PIN diode. High-frequency switches 36 having controlled PIN diodes are particularly suitable for use in nuclear magnetic resonance equipment. The PIN diode can be supplied, via high-frequency inductors 38, with a control current for setting the conductive condition, and can be supplied with an inhibit voltage for setting the inhibited condition. Decoupling capacitors 40 prevent the control current or the control voltage from proceeding into the respectively neighboring local antenna 24, so that separate control of the left and right local antennas 24 is not needed. The two local antennas 24 are connected in parallel within the local antenna system 22 via decoupling capacitors 40. The signal feed or signal pick-up of the local antenna system 22 ensues through a matching network 41, having two tuning capacitors 42 and 44 and a matching capacitor 46. The tuning capacitors 42 and 44 of the matching network 41 allow for any residual detuning of the local antenna system 22 which may still be needed, despite the shield 30 as a consequence of the different loads or different fillings. The tuning capacitors 42 and 44 are respectively connected in series between the junctions of the coupling capacitors 40, and also form the aforementioned parallel capacitance which operates in combination with the shield 30. The junction of the series circuit of the tuning capacitors 42 and 44 is connected to the reference potential conductor 32. The signal feed or signal pick-up ensues through the matching capacitor 46, which has one side connected to one of the junction points between the coupling capacitors 40 and the reference potential conductor 32. Because capacitance values of the two tuning capacitors 42 and 44 are varied dependent on the filing of the local antenna 24, the capacitance value of the shortening capacitor 28 should lie between the value which the tuning capacitors 42 and 44 will respectively have given minimum and maximum filling of the local coil. The shortening capacitor 28 can also be tunable, as the tuning capacitors 42 and 44, in order to always maintain the voltage node in the immediate proximity of the slot 34.

Figure 3:
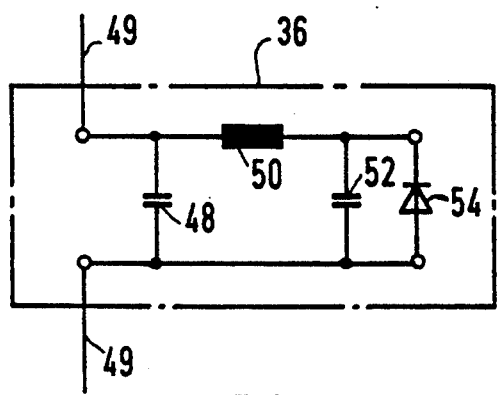
FIG. 3 is a circuit diagram of a high-frequency switch, constructed in accordance with the principles of the present invention, for use in each of the coils of the local antenna system shown in FIG. 2.

A good utilization of the breakdown capacity of the high-frequency switches 36 incorporating PIN diodes is achieved if the PIN diodes are not directly connected into the turns 26, but are instead connected thereto through a quarter-wave line. A high-frequency switch 36 having a quarter-wave line composed of discrete elements, which is terminated by a controllable PIN diode, is shown in FIG. 3. A first capacitor 48 is connected between the terminals 49, with the quarter-wave line being formed by the high-frequency switch 36, or a quarter-wave network can be connected with the winding. A series circuit composed of an inductance 50 and a second capacitor 52 is arranged parallel to the first capacitor 48.

A PIN diode 54 is connected in parallel to the second capacitor 52. The PIN diode 54 is caused to transmit or inhibit dependent on a control signal supplied through the terminals 49. The network transforms the "short" or "no-load" condition at the terminals 49 generated by the PIN diode 54 respectively into a no-load or short.

The local antenna system 22 shown in FIG. 2 is especially suitable for mammography. The decoupling of the local antennas 24 from each other, i.e., the switching from doubled operation to individual operation, ensues through the high-frequency switches 36, as does decoupling from a separate transmission antenna, which may be present. As a result of the completely separate structure of the individual local antennas 24 in the local antenna system 22, and the separate shields 30, a mutual decoupling of approximately 23 dB is achieved given individual operation of the local antenna system 22. The local antenna system 22 has a high sensitivity homogeneity, given individual and double operation, because the body parts to be examined are completely surrounded with two turns each. It has been shown that the signal-to-noise ratio improves by a factor 1.36 in practice when switching from double operation to individual operation with the local antenna system 22. This value comes close to the theoretically possible improvement of the signal-to-noise ratio of $\sqrt{2}^-$.

Although modifications and changes may be suggested by those skilled in the art, it is the intention of the inventor to embody within the patent warranted hereon all changes and modifications as reasonably and properly come within the scope of his contribution to the art.

We claim as our invention:

1. A local antenna for transmitting and receiving radio frequency signals in a nuclear magnetic resonance imaging apparatus, said local antenna comprising:

first and second axially spaced sub-antennas each consisting of at least one turn of a conductor and each having the same winding direction;

capacitive means connected in series with and between said first and second sub-antennas for shortening the path length effective for radio frequency signals between said first and second sub-antennas; and a parallel capacitance connected in parallel with the series-connected first and second sub-antennas and capacitive means, said parallel capacitance and said capacitive means each having a capacitance and the capacitance of said capacitive means and the capacitance of said parallel capacitance being substantially the same.

2. A local antenna as claimed in claim 1 further comprising:
a high-frequency shield disposed at the exterior of each of said first and second sub-antennas, said high-frequency shield have a slot therein in an axial direction disposed opposite said capacitive means.

3. A local antenna as claimed in claim 1 further comprising a controllable high-frequency switch connected in each of said first and second sub-antennas opposite said capacitive means.

4. A local antenna as claimed in claim 3 wherein said high-frequency switch comprises:
a quarter-wave line having one end connected to the sub-antenna in which said high-frequency switch is contained; and a controllable PIN diode connected at an opposite end of said quarter-wave line.

5. A local antenna as claimed in claim 4 wherein said quarter-wave line consists of discrete components.

6. A local antenna as claimed in claim 4 wherein said high-frequency switch comprises:
a first capacitor having a series circuit connected thereto consisting of a second capacitor and an inductor, said second capacitor being bridged by said PIN diode.

7. A local antenna as claimed in claim 1 further comprising:
a further local antenna identical to said local antenna, said local antenna and said further local antenna being disposed side-by-side with the respective capacitive means of said local antenna and said further local antenna facing each other, and said local antenna and said further local antenna being electrically connected in parallel to form, in combination, a local antenna system.

8. A local antenna as claimed in claim 7 wherein said local antenna and said further local antenna are disposed side-by-side in one plane.

9. A local antenna as claimed in claim 7 wherein said local antenna and said further local antenna are electrically connected in parallel by two parallel connecting branches, each parallel connecting branch containing two coupling capacitors connected in series at a junction point, and said local antenna system further including a matching network, including said parallel capacitance connected between said junction points of the respective coupling capacitors in said parallel connecting branches.

10. A local antenna as claimed in claim 9 wherein said matching network of said local antenna system includes two tuning capacitors, forming said parallel capacitance, and one matching capacitor, said first and second tuning capacitors being connected in series between said respective junction points of said coupling capacitors in said parallel connecting branches, and said matching capacitor having one side connected to one of said junction points, and a high-frequency shield connected to a junction point between said first and second tuning capacitor.

* * * * *